United States Patent
Kaneko

(10) Patent No.: US 8,067,695 B2
(45) Date of Patent: Nov. 29, 2011

(54) WIRING BOARD AND METHOD OF MANUFACTURING THE SAME

(75) Inventor: Kentaro Kaneko, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 12/628,281

(22) Filed: Dec. 1, 2009

(65) Prior Publication Data

US 2010/0147560 A1     Jun. 17, 2010

(30) Foreign Application Priority Data

Dec. 12, 2008   (JP) .................................. 2008-317410

(51) Int. Cl.
*H05K 1/00*     (2006.01)

(52) U.S. Cl. ......... 174/250; 361/558; 361/767; 174/557
(58) Field of Classification Search .................. 174/250, 174/266, 557; 361/760, 763, 784, 558, 767
See application file for complete search history.

(56) References Cited

U.S. PATENT DOCUMENTS

| 6,687,985 | B2 * | 2/2004 | Sakamoto et al. ............... 29/830 |
| 2003/0015342 | A1 * | 1/2003 | Sakamoto et al. ............ 174/250 |
| 2008/0006942 | A1 | 1/2008 | Park et al. |
| 2008/0090335 | A1 * | 4/2008 | Morimoto et al. ............ 438/118 |
| 2008/0116565 | A1 * | 5/2008 | Hsu et al. ....................... 257/699 |

FOREIGN PATENT DOCUMENTS

JP     2008-16819 A1     1/2008

\* cited by examiner

*Primary Examiner* — Yuriy Semenenko
*Assistant Examiner* — Andargie M Aychillhum
(74) *Attorney, Agent, or Firm* — Kratz, Quintos & Hanson, LLP

(57) ABSTRACT

A wiring board (package) includes: a cavity formed at a position corresponding to a chip mounting area of the outermost insulating layer on one side of both surfaces of the wiring board; a pad exposed from the surface of the insulating layer in the cavity; and a pad exposed from the surface of the insulating layer in a peripheral region of the cavity. A chip is flip-chip bonded to the pads in the cavity of the package, and another package is bonded to the pads in the peripheral region of the cavity, to thereby form a semiconductor device having a package on package (POP) structure.

6 Claims, 8 Drawing Sheets

WIRING BOARD AND METHOD OF MANUFACTURING THE SAME

CROSS-REFERENCE TO RELATED APPLICATIONS

This application is based on and claims priority of Japanese Patent Application No. 2008-317410 filed on Dec. 12, 2008, the entire contents of which are incorporated herein by reference.

BACKGROUND OF THE INVENTION (a) Field of the Invention

The present invention relates to a wiring board and a method of manufacturing the same. More specifically, the invention relates to a wiring board having a structure in which terminals (pads) for mounting a semiconductor element (chip) or the like or for external connection are exposed from an outermost insulating layer, and also to a method of manufacturing the same.

In the description below, the wiring board is also referred to as a "semiconductor package" for the sake of convenience.

(b) Description of the Related Art

In a trend to make semiconductor devices smaller (thinner) in size and higher in performance (function), there is a demand for package-on-package (POP) bonding for the purpose of reducing the mounting area of a semiconductor device in which electronic components such as semiconductor chips are mounted on wiring boards (in semiconductor packages). In the POP bonding, packages each including a semiconductor chip or the like mounted thereon are stacked in the vertical direction (height direction) thereof.

As one of methods of implementing the POP bonding, there is a method in which upper and lower packages are bonded to each other with an interposer placed therebetween. With this method, a semiconductor device is formed with a structure in which: a semiconductor chip is flip-chip bonded to the lower package (wiring board); terminals (pads) of the lower package are formed in a peripheral region of the chip on the lower package; terminals (pads) of an upper package (wiring board) are formed on the mounting surface side of the upper package in a region corresponding to the peripheral region; and the terminals of the lower and upper packages are bonded to each other via external terminals formed on both surfaces of an interposer having a thickness larger than that of the chip (inclusive of the electrode terminals thereof).

According to the bonding method, a process for fabricating the interposer is required additionally. The typical process for the fabrication includes the steps of: preparing a core member; forming through holes at required positions of the core member; filling the through holes with a conductor; forming resist layers on both surfaces; forming wiring layers in a required pattern in connection with the conductor; removing the resist layers; forming insulating layers (solder resist layers) through which external terminal formation portions of the wiring layer are exposed; and performing a required plating (nickel/gold plating or the like) on the external terminal formation portions.

In addition, as another method of implementing the above POP bonding, there is a method in which terminals (pads) of upper and lower packages are bonded to each other using solder. With this method, a semiconductor device is formed with a structure in which: a semiconductor chip is flip-chip bonded to the lower package (wiring board); and terminals (pads) formed in a peripheral region of the chip on the lower package are bonded via solder bumps to terminals (pads) formed on the mounting surface side of the upper package (wiring board) in a region corresponding to the peripheral region on the lower package.

An example of the techniques related to the above POP bonding is described in Japanese unexamined Patent Publication (JPP) (Kokai) 2008-16819. This publication discloses a bottom board (wiring board) of package-on-package structure which is electrically connected to a top board (wiring board) by solder balls. The bottom board includes a core board, pads formed on the surface of the core board corresponding to the positions of the solder balls, insulating layers stacked on the core board, through holes formed by removing portions of the insulating layers so that the pads are exposed, and a metal layer formed by filling the through holes and electrically connected to the solder balls.

As described above, in the conventional techniques, connection using an interposer or solder is performed for implementing POP bonding. However, in the case where an interposer is used for bonding, there arises a problem in that another process (considerable manufacturing steps) for fabricating the interposer is required, and a material for fabricating the interposer is required as well, to thus increase the manufacturing cost.

On the other hand, in the case where solder is used for bonding, the gap between the upper and lower packages is large because of the presence of the chip mounted between the packages. Accordingly, a large amount of solder (bump) is used for bonding the packages together. In this case, there are inconveniences such as separation of the bump (solder) during reflow soldering, and formation of a bridge between adjacent bumps. This leads to a problem in that the reliability of bonding between the upper and lower packages decreases.

In addition, because of the presence of the chip mounted between the upper and lower packages, both of the above bonding methods have another problem in that, where the chip has a large thickness, the whole POP structure cannot be constructed as small and thin as desired.

SUMMARY OF THE INVENTION

An object of the present invention is to provide a wiring board which enables easier POP bonding with low costs and which achieves an improvement in the reliability of the bonding while contributing to making a smaller and thinner structure, and a method of manufacturing the same.

According to one aspect of the invention, there is provided a method of manufacturing a wiring board, including: forming a first resist layer on a support base material, the first resist layer being patterned to have only a portion corresponding to a position of a cavity to be formed; forming a support base member having a step portion by removing a required amount of the support base material with the first resist layer being used as a mask; forming a second resist layer on a surface of the support base member where the step portion is formed, after removing the first resist layer, the second resist layer being patterned to have first and second opening portions at positions on and outside the step portion, respectively; forming first and second pads on the support base member exposed from the first and second opening portions of the second resist layer, respectively; forming an insulating layer on the support base member after removing the second resist layer, the insulating layer covering the first and second pads; forming an opening portion through which a portion of each of the pads is exposed from a top surface of the insulating layer; forming a wiring layer on the insulating layer, the wiring layer including vias connected to the pads, respectively; and alternately stacking a required number of insulating layers and wiring layers and then removing the support base member.

With the method of manufacturing a wiring board according to this aspect, in the wiring board to be obtained eventually, a cavity is formed at a position corresponding to an electronic component mounting area of the outermost insulating layer (for example, resin layer), the first pad is exposed from the surface of the insulating layer in the cavity, and the second pad is also exposed from the surface of the insulating layer in the peripheral region of the cavity. Specifically, the surface of the insulating layer from which the first pad is exposed is formed at a lower position than the surface of the insulating layer from which the second pad is exposed. Accordingly, POP bonding can be easily performed by using the second pad arranged in the peripheral region of the cavity as a terminal for POP bonding.

Namely, an electronic component (such as a semiconductor chip) mounted on the wiring board can be placed within the cavity, so that the gap between the present package and another package bonded to the second pad in the peripheral region of the cavity can be made relatively narrow. Thus, without placing the interposer such as employed in the prior art, the upper and lower packages can be easily bonded via a small amount of solder (solder bump or the like) in accordance with the gap which is made narrow. Consequently, since no interposer is needed in performing POP bonding, a reduction in cost can be achieved.

Moreover, the amount of use of the solder (bump) for bonding the upper and lower packages can be less when performing POP bonding, so that the inconveniences (separation of solder, formation of a bridge and the like) such as encountered in the prior art can be removed. This advantage contributes to an improvement in the reliability of the bonding.

Furthermore, since the electronic component to be mounted can be placed within the cavity, the height of the wiring board can be made relatively small, which in turn contributes to making a smaller and thinner structure. As a result, it becomes possible to achieve a desired smaller and thinner structure in implementing a POP structure.

According to another aspect of the invention, there is provided a method of manufacturing a wiring board, including: forming a first resist layer on a support base material, the first resist layer being patterned to have an opening portion at a portion corresponding a position of a cavity to be formed; forming a support base member having a step portion by forming a sacrifice conductive layer with a required thickness on the support base material exposed from the opening portion of the first resist layer; forming a second resist layer on a surface of the support base member where the step portion is formed, after removing the first resist layer, the second resist layer being patterned to have a first opening portion at a position on the sacrifice conductive layer in an upper portion of the step portion, and to have a second opening portion at a position outside the step portion, forming first and second pads on the sacrifice conductive layer and the support base member exposed from the first and second opening portions of the second resist layer, respectively; forming an insulating layer on the sacrifice conductive layer and the support base member after removing the second resist layer, the insulating layer covering the first and second pads; forming an opening portion through which a portion of each of the pads is exposed from a top surface of the insulating layer; forming a wiring layer on the insulating layer, the wiring layer including vias connected to the pads, respectively; and alternately stacking a required number of insulating layers and wiring layers and then removing the support base member and the sacrifice conductive layer.

With the method of manufacturing a wiring board according to this aspect, since the wiring board to be eventually obtained has the same structure, the same operational effects can be brought about as in the case of the method of manufacturing a wiring board according to the aforementioned aspect.

With reference to the following embodiments of the invention, descriptions are given below of other features in configuration of the wiring board and the method of manufacturing thereof according to the present invention, and characteristic advantages based on the features thereof, and so on.

DESCRIPTION OF THE PREFERRED EMBODIMENTS

Hereinafter, descriptions are given below of preferred embodiments of the present invention with reference to the accompanying drawings.

First Embodiment; See FIGS. 1 to 6

Figure 1:
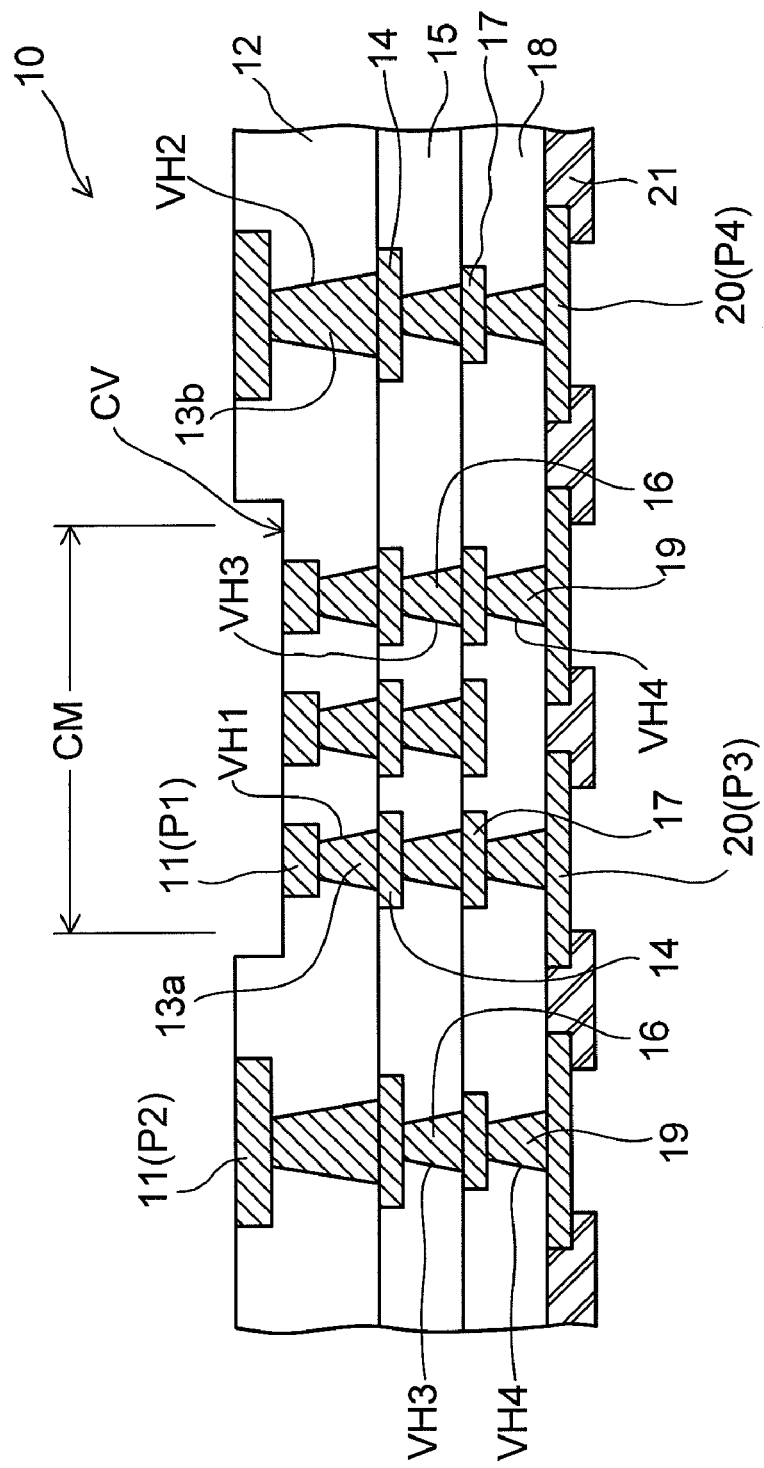
FIG. 1 is a cross-sectional view showing a configuration of a wiring board (semiconductor package) according to a first embodiment of the present invention.

FIG. 1 shows a configuration of a wiring board (semiconductor package) according to a first embodiment of the present invention, in the form of a cross-sectional view.

The wiring board (semiconductor package) 10 according to the present embodiment has a structure in which a plurality of wiring layers 11, 14, 17 and 20 are stacked one on top of another with insulating layers (specifically, resin layers) 12, 15 and 18 interposed between corresponding wiring layers, as illustrated. In this structure, the wiring layers 11, 14, 17 and 20 are connected via conductors (vias 13a and 13b, 16 and 19), respectively, filled into via holes VH1 and VH2, VH3 and VH4 each formed in a corresponding one of the insulating layers 12, 15 and 18. Namely, the package 10 has the form of a "coreless substrate," which does not include a support base member, and is different from a wiring board fabricated by using a general build-up process (in which a required number of build-up layers are sequentially formed and stacked on both surfaces or either surface of a core substrate serving as a support base member).

A recessed portion (cavity) CV characterizing the present invention is formed on the resin layer 12, which is the outermost layer on one (top side in the illustrated example) of surface sides of the coreless substrate. An electronic component (chip) such as a semiconductor element to be mounted on the package 10 is placed in the cavity CV. Accordingly, the cavity CV is formed at a position corresponding to a chip mounting area CM on the resin layer 12 as illustrated. The cavity CV is formed in a size slightly larger than the chip mounting area CM and with a required depth.

Moreover, in addition to the role of placing the chip therein, the cavity CV serves a role as a "dam" for blocking resin out flowing from a gap between the package 10 and a chip onto the periphery thereof when the chip is mounted on the package 10, and under fill resin is filled into the gap therebetween as will be described later.

On the surface where the cavity CV is formed, two kinds of pads P1 and P2 (portions each defined at a predetermined position of the wiring layer 11) are exposed. The pads P1 and P2 are formed in a manner that the surfaces thereof are flush with the surface of the resin layer 12 as illustrated. However, since the pads P1 are arranged at the chip mounting area CM in the cavity CV, and the pads P2 are arranged in a peripheral region of the cavity CV, the surfaces of the pads P1 are located at a position recessed from the position of the surfaces of the pads P2 to the inner side of the board by the amount equivalent to the depth of the cavity CV, as illustrated.

Meanwhile, on a surface (a lower side surface in the illustrated example) on the opposite side to the side where the pads P1 and P2 are formed, a solder resist layer (insulating layer) 21 functioning as a protection film is formed so as to cover the surface of the outermost wiring layer (wiring layer 20 in the illustrated example) except for the portions of pads P3 and P4 each defined at a required position of the outermost wiring layer. Among the pads P3 and P4 exposed from the solder resist layer 21, the pads P3 are connected to the pads P1 in the chip mounting area CM through the vias 19, the wiring layer 17, the vias 16, the wiring layer 14 and the vias 13a. In addition, the pads P4 are connected to the pads P2 in the peripheral region of the chip mounting area CM through the vias 19, the wiring layer 17, the vias 16, the wiring layer 14 and the vias 13b.

In the present embodiment, electrode pads of an electronic component (chip) such as a semiconductor to be mounted on the package 10 are flip-chip bonded, by use of a conductor material such as a solder bump, to the pads P1 among the pads P1 and P2 exposed from the resin layer 12 on the surface where the cavity CV is formed. Moreover, electrode pads of another package to be package on package (POP) bonded to the package 10 are bonded to the pads P2 by use of a conductor material such as a solder bump. Meanwhile, external connection terminals such as solder balls used in mounting the package 10 on a motherboard or the like are bonded to the pads P3 and P4 exposed from the solder resist layer 21 on the bottom side. Specifically, the surface where the cavity CV is formed is used as a "chip mounting surface (package bonding surface)," and the surface where the solder resist layer 21 is formed is used as an "external connection terminal bonding surface."

However, depending on conditions where this package 10 is used, use conditions of this package 10, an arrangement form for POP bonding or the like, the package 10 can be used in a form in which the chip mounting surface (package bonding surface) and the external connection terminal bonding surface are set upside down.

Note that, the solder resist layer 21 formed on one of the surfaces of the package 10 fulfills a function as a reinforcing layer in addition to the function as a protection film. Specifically, the package 10 is a coreless substrate having a low rigidity, and the thickness thereof is also thin, so that it is undeniable that the strength of the board decreases more than a little. However, the solder resist layer 21 is formed on one of the surfaces of the board as illustrated in order to reinforce the board.

The specific material, size, thickness and the like of each of the members forming the wiring board (semiconductor package) 10 according to the present embodiment are specifically described in relation to processing to be described later.

Next, the description is given of a method of manufacturing the wiring board (semiconductor package) 10 according to the present embodiment with reference to FIGS. 2A to 4C showing an example of the manufacturing steps.

Figure 2A:
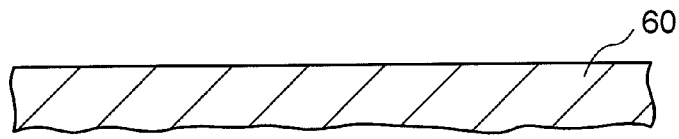
FIGS. 2A to 2E are cross-sectional views showing steps of a method of manufacturing the wiring board shown in FIG. 1.
Figure 2B:
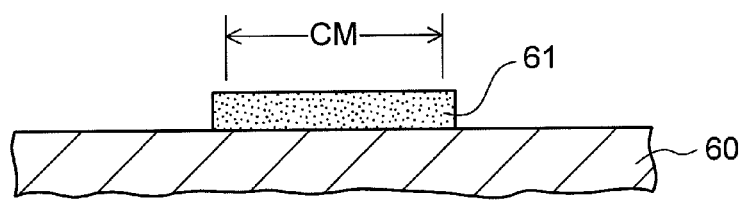
Figure 2C:
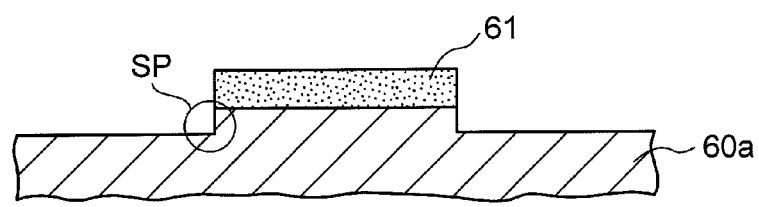
Figure 2D:
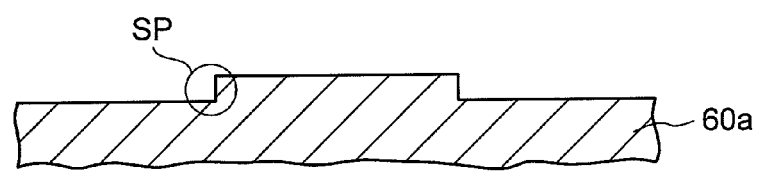

First, a support base member 60 is prepared as a temporary board in the initial step (see FIG. 2A). As a material for the support base member 60, a metal (typically, copper (Cu)) soluble in an etchant is used in considering that the material is eventually etched away as described later. Moreover, a metal plate or a metal foil is sufficient for use as a form of the support base member 60, basically. Specifically, a structure (for example, the support base member disclosed in JPP (Kokai) 2007-158174)) obtained by the following manner can be preferably used as the support base member 60. An underlying layer and a copper foil are disposed on a prepreg (e.g., a bonding sheet in a semi-cured B stage, formed by impregnating a thermosetting resin such as an epoxy-base resin or a polyimide-base resin into a glass fiber which is a reinforcement material), and then heat and pressure are applied to the prepreg to obtain the structure, for example.

In the next step (see FIG. 2B), an etching resist is formed on the support base member 60 by using a patterning material, and a resist layer 61 is formed in a required shape by patterning. The resist layer 61 is patterned so as to have only a portion corresponding to a position of the cavity CV (in size slightly larger than the chip mounting area CM) to be eventually formed on the resin layer 12, which is the outermost layer of the chip mounting surface side (package bonding surface).

A photosensitive dry film (a structure in which a resist material is held between a polyester cover sheet and a polyethylene separator sheet) or a liquid photoresist (liquid resist such as a novolak-base resin or an epoxy-base resin) can be used as the patterning material. For example, in a case where the dry film is used, the surface of the support base member 60 is cleaned, and thereafter, the dry film is attached thereunto by thermal compression bonding. The dry film is then cured by subjecting the dry film to exposure under ultraviolet (UV) irradiation by use of a mask (not illustrated) patterned in a required shape. Thereafter, a portion other than the corresponding portion is etched away by use of a predetermined developing solution. The resist layer 61 in accordance with the required shape of the cavity CV is thus formed. The resist layer 61 can be formed through the same steps in a case where the liquid photoresist is used as well.

In the next step (see FIG. 2C), etching is performed on the support base member 60 on which the resist layer (etching resist) 61 is formed. Here, the etching is performed on the support base member 60 by using the etching resist 61 as the mask to form a required depth. For example, the support base member (Cu) 60 is selectively etched away by a required amount with respect to the resist layer 61 by wet etching using a ferric chloride aqueous solution, a copper chloride aqueous solution, an ammonium persulfate aqueous solution or the like. Thereby, a support base member 60a having a step portion SP in accordance with the etching amount is formed as illustrated.

The step portion SP (i.e., the etching amount) of the support base member 60a defines the depth of the cavity CV to be formed, so that the etching conditions, etching time or the like needs to be appropriately selected in consideration of the size of a chip to be mounted, the amount of resin out flowing from a gap between the chip and package onto the periphery thereof when under fill resin is filled into the gap at the time of mounting the chip, or the like.

In the next step (see FIG. 2D), the resist layer 61 used as the etching resist is removed. For example, in a case where a dry film is used as the etching resist, an alkaline chemical liquid such as sodium hydroxide or a monoethanolamine-base liquid can be used for removal. Further, in a case where a liquid resist such as a novolak-base resin or an epoxy-base resin is used as the etching resist, acetone, alcohol or the like can be used for removal. In this manner, the support base member 60a having the required step portion SP is formed as illustrated.

In the next step (see FIG. 2E), a plating resist is formed by use of a patterning material on a surface where the step portion SP (FIG. 2D) on the support base member 60a is formed. Then, openings are formed at required portions in the plating resist in positions on and outside the step portion SP (formation of a resist layer 62 including opening portions OP1 and OP2). The opening portions OP1 and OP2 are formed in the chip mounting area CM and at the portion corresponding to the periphery thereof, respectively. Here, the opening portions OP1 and OP2 are patterned in accordance with the shapes of the pads P1 and P2 required to be formed, respectively. As the patterning material, a photosensitive dry film or a liquid photo resist can be used as in the case of the material used in the step in FIG. 2B.

In the next step (see FIG. 3A), the wiring layer 11 is formed on the support base member (Cu) 60a by electrolytic plating using the support base member 60a as a power feeding layer, the support base member 60a exposed through the opening portions OP1 and OP2 (FIG. 2E) opened at the resist layer 62. The portions respectively defined at predetermined multiple positions of the wiring layer 11 function as the pads P1 for mounting a chip and the pads P2 for POP bonding another package, respectively.

Each of the pads P1 and P2 to be formed is in a circular shape although it is not illustrated in particular. Moreover, the size (diameter) of the pad P1 for mounting a chip is selected to be approximately 50 to 150 μm, and the size (diameter) of the pad P2 for mounting another package is selected to be approximately 200 to 1000 μm. Further, each of the pads P1 and P2 is formed of a structure in which multiple metal layers are stacked one on top of another. As the material forming the lowermost metal layer (metal layer on a surface side to be exposed eventually) in this structure, a metal species insoluble in an etchant is selected in considering that the support base member 60a in contact with the lowermost metal layer is eventually etched away. In the present embodiment, since copper (Cu) is used as the material for the support base member 60a, gold (Au) is used as a metal different from copper in considering that good contact characteristics (soldering characteristics) can be secured.

Specifically, an Au layer having a thickness of approximately 40 nm is formed first on the support base member (Cu) 60a by flash plating with Au, and a Pd layer having a thickness of approximately 20 nm is further formed by flash plating with palladium (Pd). Thereby, an Au/Pd layer is formed. Next, a Ni layer having a thickness of approximately 5 μm is formed on the Au/Pd layer by nickel (Ni) plating, and a Cu layer having a thickness of approximately 15 μm is further formed on the Ni layer by Cu plating. Herein, the Pd layer is formed in order to prevent the Au layer, which is the lower layer thereof, from being oxidized. Further, the Ni layer is formed in order to prevent the copper (Cu) contained in the metal layer, which is the upper layer thereof, from diffusing into the Au/Pd layer, which is the lower layer thereof.

To be more specific, in this step, the pads P1 and P2 each formed of a three-layer structure (strictly speaking, four-layer structure) including the Au/Pd layer, the Ni layer and the Cu layer are formed. Note that, although the Au/Pd layer is formed as the lowermost metal layer in this step, the Pd layer does not have to be necessarily formed, and this layer may be a metal layer formed of only the Au layer.

In the next step (see FIG. 3B), the resist layer 62 used as the plating resist is removed. The removal method is the same as that described in the step in FIG. 2D. In this manner, a structure including the pads P1 (wiring layer 11) and the pads P2 (wiring layer 11) is fabricated, the pads P1 and the pads P2 formed in positions, respectively, on and outside the step portion SP on the support base member 60a as illustrated.

In the next step (see FIG. 3C), the insulating layer 12 formed of an epoxy-base resin, a polyimide-base resin, or the like is formed on the surface of the support base member 60a where the pads 1P and 2P are formed. For example, an epoxy-base resin film is laminated on the support base member 60a and the pads 1P and 2P (wiring layer 11), and then, the resin film is cured by heat process at a temperature of 130 to 150° C. while the resin film is pressed. Thereby, the resin layer (insulating layer 12) can be formed. In this case, since the thickness of the resin film is relatively thin as compared with the step portion SP of the support base member 60a, it is difficult to secure flatness of the surface of the insulating layer 12 by one laminating operation. Thus, it is preferable to perform two laminating operations separately.

In the next step (see FIG. 3D), opening portions (via holes VH1 and VH2) extending to the pads P1 and P2, respectively, are formed at predetermined portions (portions corresponding to the pads P1 and P2) of the insulating layer 12 by a hole making process with a $CO_2$ laser, an excimer laser or the like. Note that, although a laser or the like is used to form the via holes VH1 and VH2 in this step, photolithography can be also used to form the required via holes when the insulating layer 12 is formed of a photosensitive resin.

In the next step (see FIG. 4A), the wiring layer 14 having a required pattern and connected to the pads P1 and P2 is formed by filling in the via holes VH1 and VH2 (formation of vias 13a and 13b) on the insulating layer 12 including the via holes VH1 and VH2 formed therein. A semi-additive process is used for formation of the wiring layer 14, for example.

Specifically, a copper (Cu) seed layer (not illustrated) is formed on the insulating layer 12 and also in the via holes VH1 and VH2 by electroless plating, sputtering or the like, first. Then, a resist film (not illustrated) is formed, the resist film including opening portions in accordance with the shape of the wiring layer 14 to be formed. Next, a conductor (Cu) pattern (not illustrated) is formed on the seed layer (Cu) by electrolytic Cu plating using the seed layer as a power feeding layer, the seed (Cu) layer exposed through the opening portions of the resist film. Furthermore, the seed layer is etched by using the conductor (Cu) pattern as the mask after the resist film is removed. Thereby, the required wiring layer 14 is obtained.

Note that, other than the semi-additive process, various wiring forming methods including a subtractive process and the like can be used. In addition, the method of forming the vias 13a and 13b is not limited to electroless plating or the like, but a screen printing method can be used to form the vias 13a and 13b by filling the holes with conductive paste (silver paste, copper paste or the like).

In the next step (see FIG. 4B), the insulating layers and the wiring layers are alternately stacked in the same manner as the process performed in the steps in FIGS. 3C to 4A. In the illustrated example, two insulating layers and two wiring layers are stacked for the simplicity of description. Specifically, a resin layer (insulating layer 15) is formed on the insulating layer 12 and the wiring layer 14. Then, the via holes VH3, which extend to the pads (not illustrated) of the wiring layer 14, respectively, are formed on the insulating layer 15. Thereafter, the wiring layer 17 having a required pattern and connected to the pads is formed by filling in these via holes VH3 (formation of the vias 16). Moreover, a resin layer (insulating layer 18) is formed on the insulating layer 15 and the wiring layer 17. Then, the via holes VH4, which extend to the pads (not illustrated) of the wiring layer 17, respectively, are formed on the insulating layer 18. Thereafter, the wiring layer 20 having a required pattern and connected to the pads is formed by filling in these via holes VH4 (formation of the vias 19). The wiring layer 20 forms the outermost wiring layer in the present embodiment.

Moreover, the solder resist layer 21 is formed so as to cover the surface (insulating layer 18 and wiring layer 20) excluding the pads 3P and 4P each defined at a predetermined position of the wiring layer 20. The solder resist layer 21 can be formed, for example, by laminating a photosensitive solder resist film or applying a liquid photoresist onto the surface, and then patterning the resist in a required shape. In this manner, the pads 3P and 4P are exposed through the opening portions of the solder resist layer 21.

To these pads P3 and P4, external connection terminals such as solder balls or pins used in mounting of the package 10 on a motherboard or the like are bonded. Thus, as in the case of the pads P1 and P2 on the chip mounting surface side (package bonding surface), Au plating is preferably performed on the pads P3 and P4 in order to improve contact characteristics. At this time, Ni plating is performed first on the pads (Cu) P3 and P4, and thereafter, Au plating is performed thereon. Specifically, a conductive layer (not illustrated) having a two-layer structure including the Ni layer and the Au layer is formed on each of the pads P3 and P4.

In the final step (see FIG. 4C), the support base member 60a used as the temporary board is selectively removed with respect to the pads P1 and P2, the resin layer 12, the pads P3 and P4, and the solder resist layer 21. For example, by wet etching using a ferric chloride aqueous solution, a copper chloride aqueous solution, an ammonium persulfate aqueous solution or the like, the support base member (Cu) 60a can be selectively etched away with respect to the pads P1 and P2 (Au layer is formed on each of the surface layer portions), the resin layer 12, the pads P3 and P4 (Au layer is formed on each of the surface layer portions) and the solder resist layer 21.

Through the aforementioned steps, the wiring board 10 (FIG. 1) of the present embodiment is fabricated.

Figure 5:
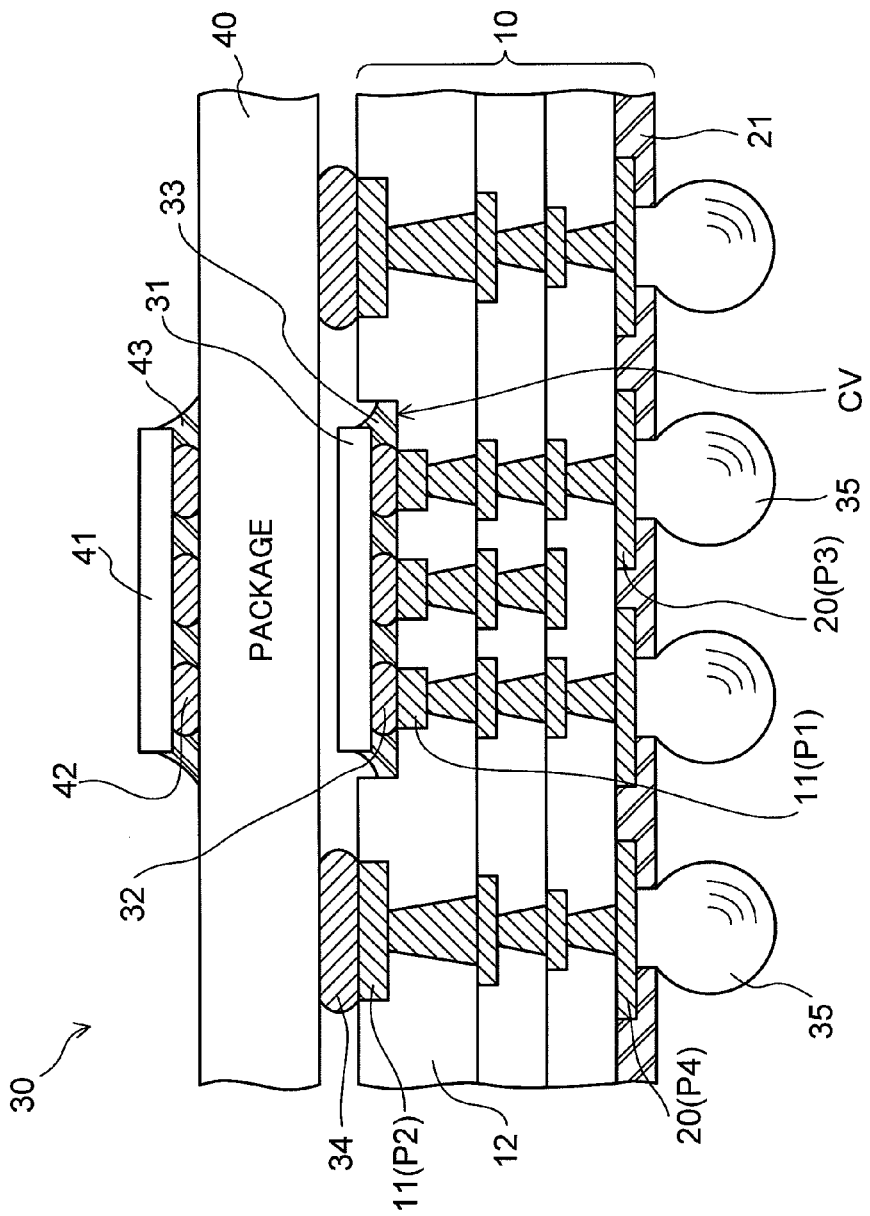
FIG. 5 is a cross-sectional view showing a configuration example (semiconductor package) in the case where a POP structure is implemented using the wiring board (semiconductor package) in FIG. 1.

In the wiring board (semiconductor package) 10 of the present embodiment, electrode pads of a chip are bonded, via solder bumps or the like, to the pads P1 exposed from one of the surfaces as described above, and electrode pads of another package are bonded to the pads P2 via solder bumps or the like. Further, external connection terminals such as solder balls are bonded to the pads P3 and P4 exposed from the other one of the surfaces. FIG. 5 shows a configuration example of the wiring board 10.

The example in FIG. 5 shows a cross-sectional structure of a state in which a semiconductor element (active device chip such as a CPU, to be specific) 31 as the electronic component is mounted on the wiring board 10, and a different package 40 is further mounted. Specifically, the example shows the cross-sectional structure in a case where a semiconductor device 30 having a POP structure is formed. The electrode pads (not shown) of the chip 31 to be mounted are flip-chip bonded to the pads P1 in the cavity CV via solder bumps 32. Since the chip 31 is mounted in the form of practically being placed within the cavity CV, the surface of the chip 31 only slightly protrudes from the surface of the outermost resin layer 12.

Moreover, under fill resin 33 (thermosetting epoxy-base resin or the like) is filled into the gap between the mounted chip 31 and the wiring board 10 (surface of the resin layer 12 facing the chip 31) and then is thermally cured. Thereby, the reliability of bonding between the chip 31 and the wiring board 10 is enhanced. The under fill resin 33 overflowed from the gap between the chip and board after the gap is filled with the resin is blocked in the cavity CV as illustrated. Specifically, by restricting the range of "outflow" of the under fill resin 33 overflowed from the gap between the chip and board onto the periphery thereof to be within the cavity CV, a circuit element, a wiring and the like (pads P2 defined at portions of the wiring layer 11 in the illustrated example) arranged around the chip are prevented from being negatively influenced by the outflow of the resin.

Moreover, to the pads P2 exposed from the resin layer 12 in the peripheral region of the cavity CV, electrode pads (not shown) formed on the mounting surface side of the different package 40 (wiring board) are bonded via solder bumps 34 (POP bonding). At the time of the bonding, since the surface of the chip 31 only slightly protrudes from the surface of the resin layer 12 as described above, the gap between the upper package 40 and the lower package 10 is made relatively narrow, and the size of each of the bumps 34 can be thus reduced by the narrowed amount. Specifically, the amount of solder to be used can be made less, so that the inconveniences (separation of solder, formation of a bridge, and the like) observed in the prior art can be resolved. This advantage contributes to an improvement in the reliability of bonding.

Moreover, a semiconductor element (chip) 41 is mounted on a surface (top side in the illustrated example) opposite to the mounting surface side of the different package 40 as in the case of the package 10. Electrode pads (not shown) of the chip 41 are flip-chip bonded to pads (not shown) on the package 40 via solder bumps 42. Further, under fill resin 43 is filled into a gap between the mounted chip 41 and the package 40 and then is thermally cured. Thereby, the chip 41 is fixed onto the package 40.

Meanwhile, solder balls 35 are respectively bonded by reflow soldering to the pads P3 and P4 on the external connection terminal bonding surface opposite to the chip mounting surface (package bonding surface) of the package 10. In the illustrated example, the form of a BGA (ball grid array) in which the solder balls 35 are bonded to the pads P3 and P4, respectively, are employed. However, instead of this form, it is also possible to employ the form of a PGA (pin grid array) in which pins are bonded to the pads, respectively, or the form of an LGA (land grid array) in which the pads themselves are made to be external connection terminals.

Figure 6:
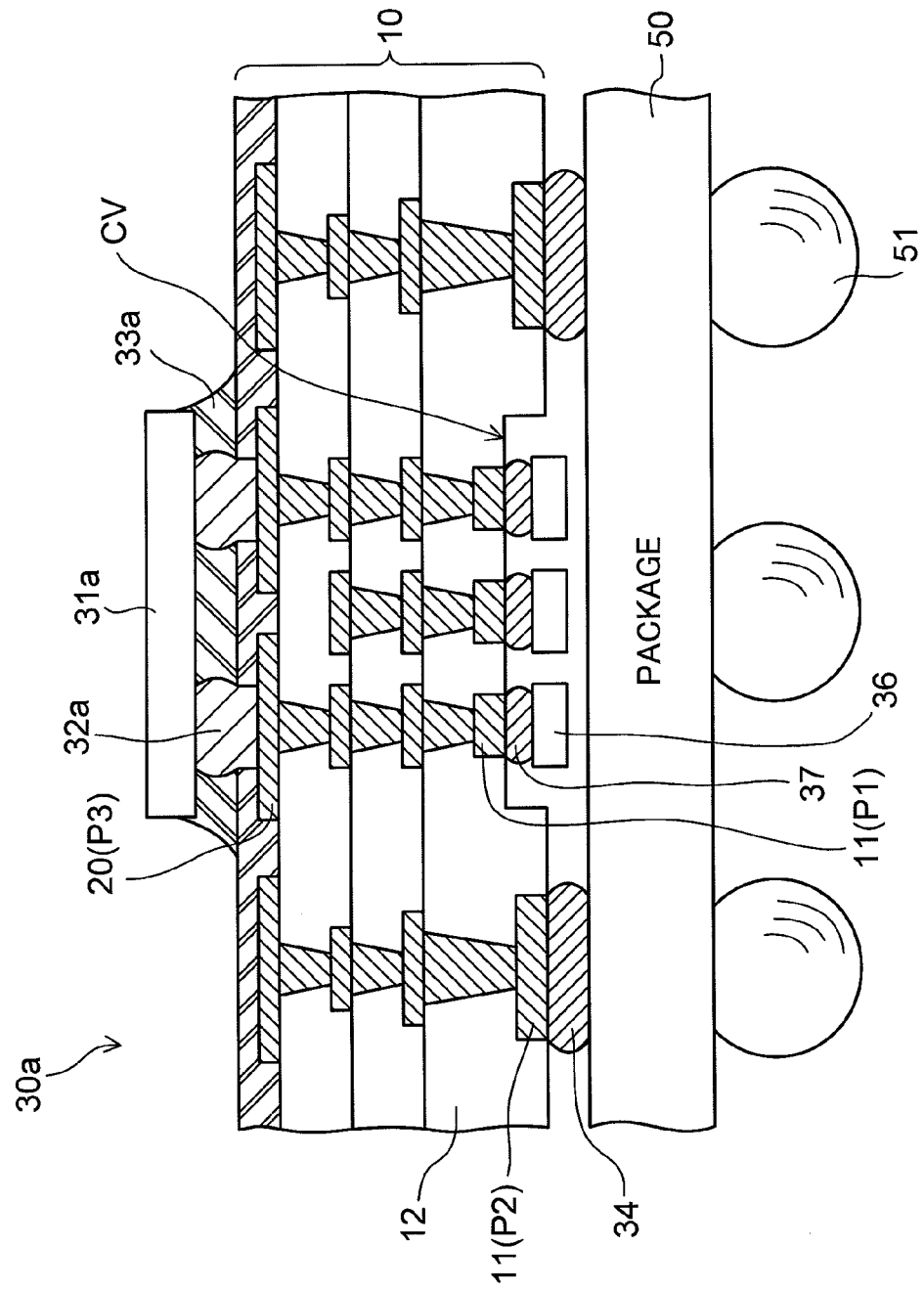
FIG. 6 is a cross-sectional view showing another configuration example (semiconductor device) in the case where a POP structure is implemented using the wiring board (semiconductor package) in FIG. 1.

In addition, as an arrangement form reverse to that in FIG. 5, the POP structure can be implemented while the chip mounting surface (package bonding surface) and the external connection terminal bonding surface are set upside down and then used. FIG. 6 shows a configuration example of this case.

The example in FIG. 6 shows a configuration (cross-sectional structure) of a semiconductor device 30a having a POP structure formed by reversing the upper and lower side relationship of the package from that shown in FIG. 5 and then mounting the package 10 on a different package 50. In the configuration example in FIG. 6, instead of the aforementioned active device (chip 31), chip capacitors 36 as passive devices are mounted in the cavity CV of the package 10. A pair of electrode terminals (not shown) of each of these chip capacitors 36 are bonded to the pads P1 via solder bumps 37, respectively. In this configuration as well, since the chip capacitors 36 are mounted in the form of practically being placed within the cavity CV, the surfaces of the chip capacitors 36 only slightly protrude from the surface of the outermost resin layer 12.

Moreover, to the pads P2 exposed from the resin layer 12 in the peripheral region of the cavity CV, electrode pads (not shown) formed on a surface (an upper side surface in the illustrated example) on the opposite side to the mounting surface side of the different package (wiring board) 50 are bonded via solder bumps 34 (POP bonding). At the time of the bonding, since the surfaces of the chip capacitors 36 only slightly protrude from the surface of the resin layer 12 as described above, the gap between the upper package 10 and lower package 50 is made relatively narrow, and the size of each of the bumps 34 can be thus reduced by the narrowed amount (the amount of solder to be used can be made less). Thereby, the inconveniences such as separation of solder and formation of a bridge, which are observed in the prior art can be resolved, and the reliability of POP bonding is thus enhanced.

In addition, electrode pads (not shown) are provided on the mounting surface side of the different package 50. Solder balls 51 as external connection terminals for use in mounting of the package 50 on a motherboard or the like are bonded to the electrode pads by reflow soldering.

Meanwhile, an active device (chip 31a) similar to the chip 31 in the configuration in FIG. 5 is mounted on the external connection terminal bonding surface opposite to the chip mounting surface (package bonding surface) of the wiring board 10. The electrode pads (not shown) of the chip 31a are flip-chip bonded to the pads P3 on the package 10 via solder bumps 32a, respectively. Further, under fill resin 33a is filled into a gap between the chip 31a and the package 10 and then is thermally cured. The chip 31a is thereby fixed onto the package 10. Note that, the illustration of the pads P4 (FIG. 5) on the external connection terminal bonding surface side of the package 10 is omitted in the example in FIG. 6.

As described above, according to the wiring board (semiconductor package) 10 of the present embodiment and the method of manufacturing the same (FIGS. 1A to 4C), the cavity CV is formed with a required depth at a portion corresponding to the chip mounting area CM on the resin layer 12, which is the outermost layer on the chip mounting surface (package bonding surface) side. In addition, the pads P1 for mounting a chip are formed, so that the surfaces thereof are flush with the surface of the resin layer 12 in the cavity CV, and the pads P2 for POP bonding are formed, so that the surfaces thereof are flush with the surface of the resin layer 12 in the peripheral region of the cavity CV. As described, the surface of the resin layer 12 where the pads P1 are exposed is formed so as to be at a position lower than the surface of the resin layer 12 where the pads P2 are exposed. Thus, POP bonding can be easily performed as shown in the configuration examples of FIGS. 5 and 6.

Specifically, the electronic component (chip 31 or chip capacitors 36) to be mounted on the package 10 can be placed within the cavity CV, so that the gap between the package 10 and the different package 40 or 50 bonded to the pads P2 in the peripheral region of the cavity CV can be made relatively narrow. For this reason, without placing an interposer as being used in the prior art, bonding (POP bonding) between the upper and lower packages can be easily performed via a small amount of solder (solder bumps 34) in accordance with the narrowed gap. In other words, since the interposer is no longer needed in performing POP bonding, a reduction in cost can be achieved.

In addition, the gap between the upper and lower packages can be made smaller when performing POP bonding, so that the amount of use of the solder (bumps) for bonding the packages becomes fewer. As a result, the inconveniences such as encountered in the prior art such as separation of solder and formation of a bridge are removed, and the reliability of bonding between the upper and lower packages is improved.

Moreover, the chip 31 or 36 to be mounted can be placed within the cavity CV, so that the height of the package 10 can be made relatively small, which in turn, contributes to making a smaller and thinner structure. As a result, it becomes possible to achieve a desired smaller and thinner structure when the packages are viewed as the whole POP structure.

Note that, although the surface of the chip 31 or 36 to be mounted in the cavity CV of the package 10 slightly protrudes from the surface of the resin layer 12 in the configuration example in FIG. 5 or 6, the whole chip can be placed within the cavity CV by forming the cavity CV with a larger depth. Thereby, the gap between the upper and lower packages can be made narrower, and the whole structure can be made thinner. In addition, the amount of usage of solder becomes less accordingly. However, in this case, duration of the etching performed in the step in FIG. 2C becomes longer. Thus, the depth of the cavity CV needs to be appropriately selected in consideration of the etching time.

Moreover, the surface where the chip is mounted (surface of the resin layer 12 where the pads P1 are exposed) is positioned in the cavity CV. Thus, it is possible to suppress "outflow" of the under fill resin 33 overflowed from the gap between the chip and board after the gap is filled with the resin as shown in FIG. 5. Specifically, by allowing the cavity CV to function as a dam, it is possible to prevent a wiring, a circuit element and the like arranged around the chip, from being negatively influenced.

Moreover, the amount of use of the outermost resin layer 12 can be adjusted by appropriately changing the depth of the cavity CV, so that warpage of the package 10, which may occur due to a difference between the thermal expansion coefficients of the resin layer 12 and the conductive layer forming the pads P1 and P2, can be suppressed.

Specifically, the package 10 is a coreless substrate which does not include a support member, thereby having a low rigidity, and the thickness thereof is also thin, so that the occurrence of warpage is assumed. In particular, the possibility that warpage of the package 10 occurs is high when the package 10 is subjected to the heat history including heat processing such as reflow soldering performed at the time of mounting a chip, and thermal curing of the under fill resin filled into the gap after the chip is mounted on the wiring board. This is because of a difference between the thermal expansion coefficients of the conductive layer and the resin layer, and also of a difference between the thermal expansion coefficients of the under fill resin and the material of the chip. In this respect, warpage of the package 10 can be suppressed by appropriately changing the depth (amount of usage of the resin layer 12) of the cavity CV as described above.

Second Embodiment; See FIG. 7

Figure 7:
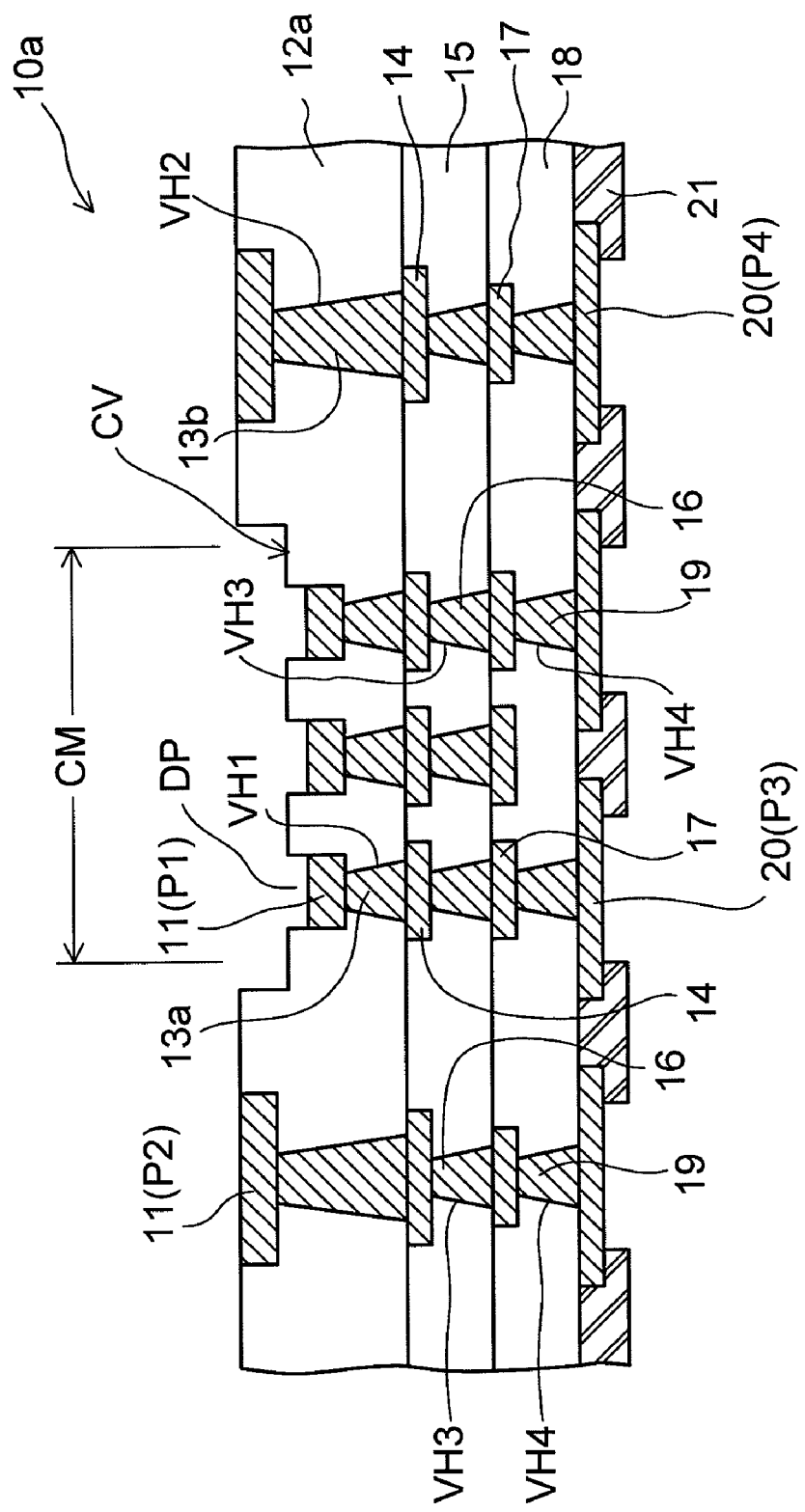
FIG. 7 is a cross-sectional view showing a configuration of a wiring board (semiconductor package) according to a second embodiment of the present invention.

FIG. 7 shows a configuration of a wiring board (semiconductor package) according to a second embodiment of the present invention, in the form of a cross-sectional view.

As compared with the configuration of the wiring board 10 (FIG. 1) according to the first embodiment, the wiring board (semiconductor package) 10a according to the second embodiment is different in that the pads P1 arranged in the chip mounting area CM in the cavity CV are formed in a way that the surfaces of the pads P1 are located at a position recessed from the bottom surface (surface of the resin layer 12a) of the cavity CV to the inner side of the board by a predetermined depth. Specifically, recessed portions DP are formed at positions corresponding to the pads P1, respectively, on the resin layer 12a in the cavity CV. Since the other configuration of the wiring board 10a is basically the same as that of the wiring board 10 in FIG. 1, the description thereof is omitted herein.

The wiring board 10a according to the present embodiment can be basically fabricated in the same manner as the processing performed in the steps (FIGS. 2A to 4C) of the aforementioned manufacturing method according to the first embodiment. However, processing steps for forming the recessed portions DP in the cavity CV are needed, so that processing performed in the steps related to the formation is slightly different. Although it is not illustrated in particular, an example of the manufacturing method is as follows.

Figure 2E:
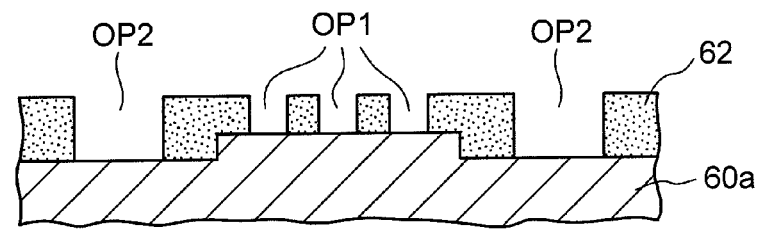

First, after the support base member 60a is formed through the steps in FIGS. 2A to 2D, in the same manner as the process performed in the step in FIG. 2E, a plating resist is formed by using a patterning material on the surface side of the support base member 60a where the step portion SP is formed, and openings are formed only at required positions (positions corresponding to the pads P1 to be formed) in the portion on the step portion SP. Specifically, a resist layer provided with only the opening portions OP1 is formed.

Next, a sacrifice conductive layer is formed with a required thickness (thickness equivalent to the depth of the recessed portions DP to be formed) on the support base member 60a by electrolytic plating using the support base member 60a as a power feeding layer, the support base member 60a exposed through the opening portions OP1 of the resist layer. As the material forming the sacrifice conductive layer, a metal species soluble in an etchant is selected in considering that the material is eventually etched away with the support member 60a in contact therewith. In this case, since copper (Cu) is used as the material of the support base member 60a, the sacrifice conductive layer (Cu) is formed on the support base member 60a by electrolytic Cu plating. Use of the same material (Cu) for these two components in this manner allows these components (the support base member 60a and the sacrifice conductive layer) to be simultaneously removed by one etching operation, and thus, contributes to simplification of the process.

Moreover, after the plating resist is removed, in the same manner as the process performed in the step in FIG. 2E, a plating resist is formed by using a patterning material on the surface side of the support base member 60a where the sacrifice conductive layer (Cu) is formed. Then, openings are formed at required portions in the plating resist in positions (positions corresponding to the pads P1 and P2) on and out-side the step portion SP, respectively. Specifically, a resist layer having the same pattern as that of the resist layer 62 in the step in FIG. 2E is formed.

Figure 3A:
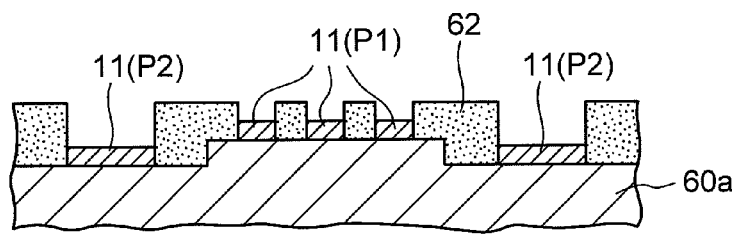
FIGS. 3A to 3D are cross-sectional views showing manufacturing steps subsequent to the steps in FIGS. 2A to 2E.
Figure 3B:
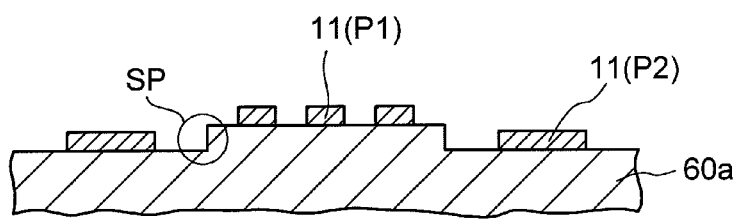
Figure 3C:
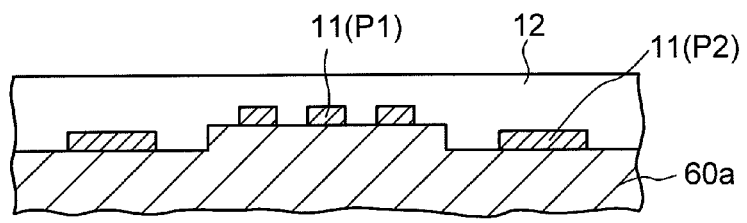
Figure 3D:
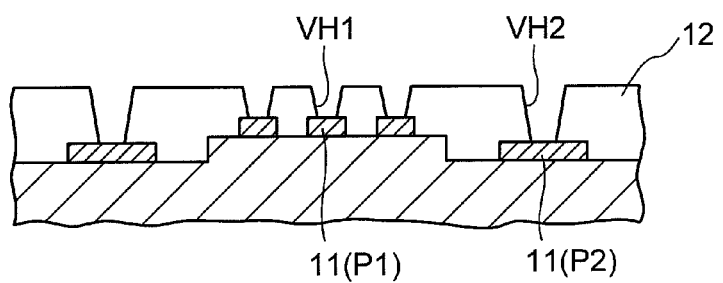
Figure 4A:
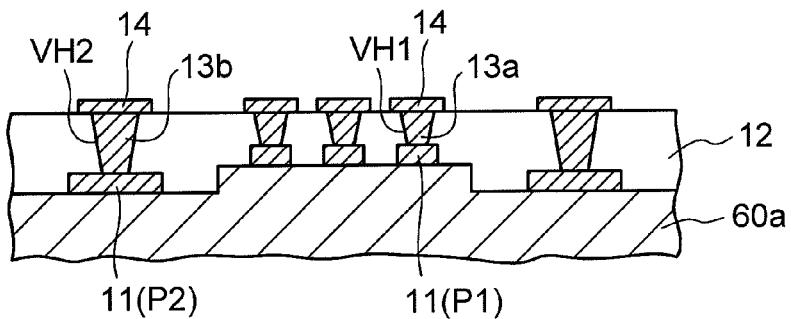
FIGS. 4A to 4C are cross-sectional views showing manufacturing steps subsequent to the steps in FIGS. 3A to 3D.
Figure 4B:
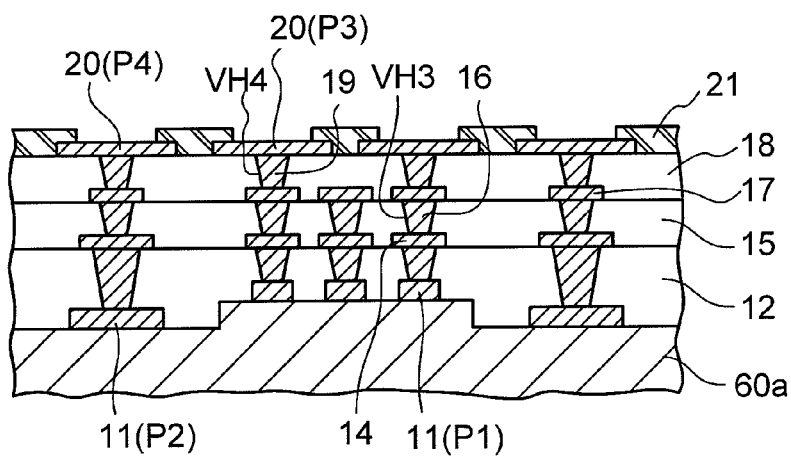
Figure 4C:
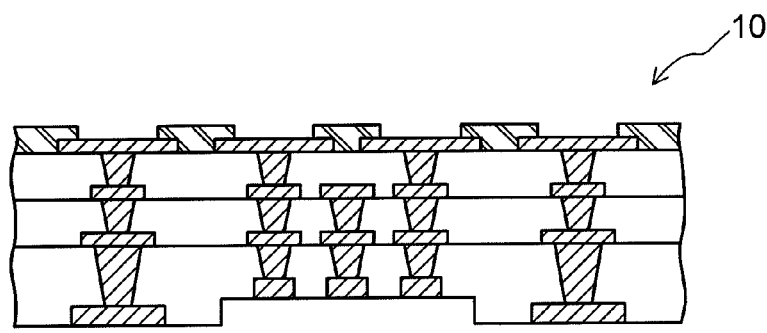

Next, in the same manner as the process performed in the step in FIG. 3A, the pads P1 and P2 are formed on the sacrifice conductive layer (Cu) and the support base member (Cu) 60a, which are exposed through the opening portions OP1 and OP2 of the resist layer, respectively. Specifically, the pads P1 and P2 are formed by sequentially stacking an Au/Pd layer (or Au layer), a Ni layer and a Cu layer by electrolytic plating using the support base member 60a as a power feeding layer. Thereafter, the plating resist is removed, and the same process as that in each of the steps in FIGS. 3C to 4B is performed. Then, the support base member (Cu) 60a and the sacrifice conductive layer (Cu) are subjected to etching together.

Through the aforementioned steps, the wiring board 10a (FIG. 7) of the present embodiment is fabricated.

Note that, the aforementioned manufacturing method is described with the example of the case where the support base member 60a and the sacrifice conductive layer, which are subjected to etching at the final stage, are formed by using the same metal material (Cu). However, the two components do not have to be made of the same material. Basically, it is sufficient as long as each of the components is formed of a material which can be "selectively" etched away with respect to the other exposed components when each of the support base member and the sacrifice conductive layer is etched away. In this case, since the support base member and the sacrifice conductive layer are formed of mutually different materials, the etching process is performed in two stages.

According to the second embodiment (FIG. 7), the following advantages can be further obtained in addition to the effects obtained in the first embodiment (FIGS. 1 to 6). Specifically, since the recessed portions DP are formed at the positions corresponding to the pads P1 on the resin layer 12a in the cavity CV, pre-solder (solder attachment) can be easily performed in the recessed portions DP. Accordingly, when an electronic component (chip) is bonded to the package 10a prior to POP bonding (FIGS. 5 and 6), position adjustment between the electrode terminals of the chip and the attached pieces of solder can be easily performed.

Third Embodiment; See FIG. 8

Figure 8:
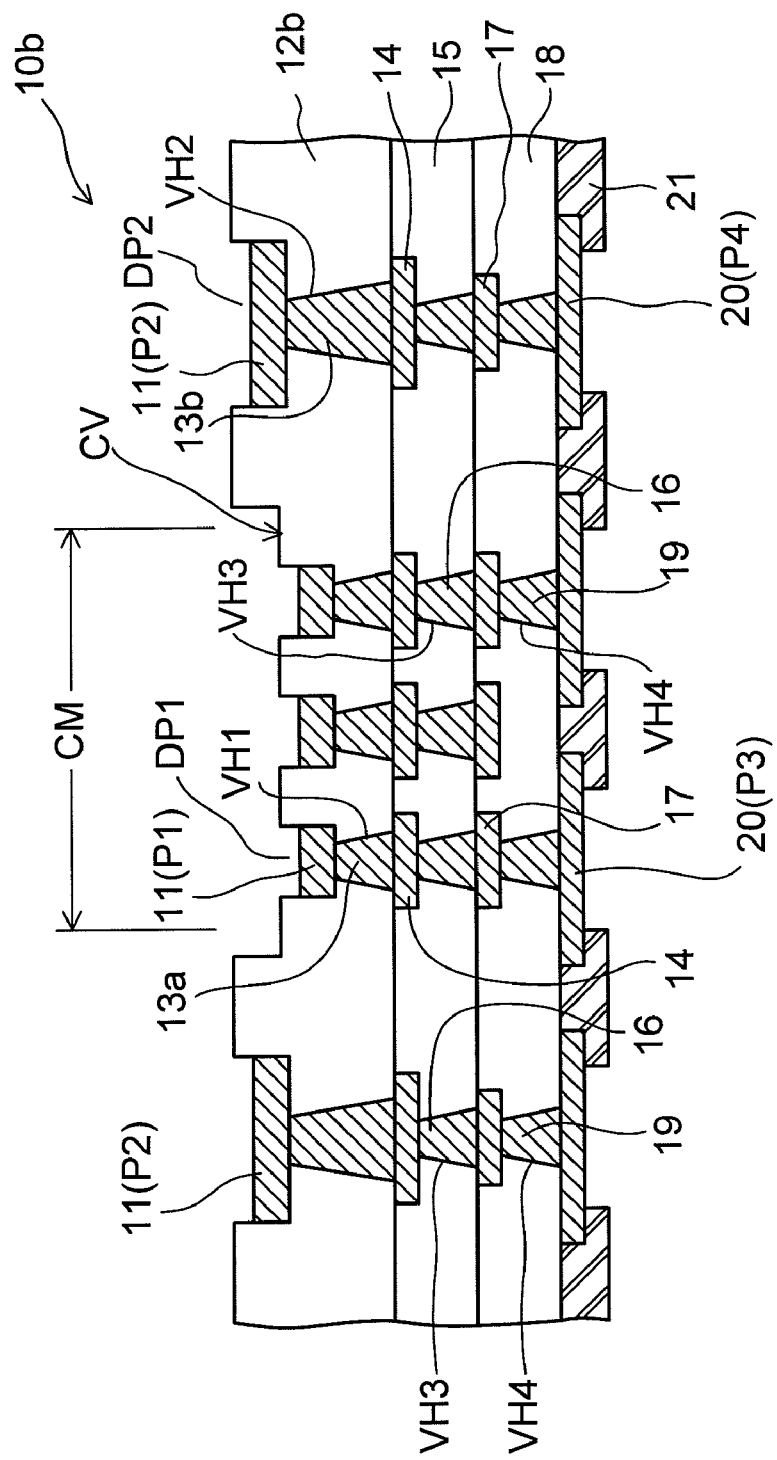
FIG. 8 is a cross-sectional view showing a configuration of a wiring board (semiconductor package) according to a third embodiment of the present invention.

FIG. 8 shows a configuration of a wiring board (semiconductor package) according to a third embodiment of the present invention, in the form of a cross-sectional view.

As compared with the configuration of the wiring board 10 (FIG. 1) according to the first embodiment, the wiring board (semiconductor package) 10b according to the third embodiment is different in the following points. First, the pads P1 arranged in the chip mounting area CM in the cavity CV are formed in a way that the surfaces of the pads P1 are located at a position recessed from the bottom surface (surface of the resin layer 12) of the cavity CV to the inner side of the board by a predetermined depth. Moreover, the pads P2 arranged in the peripheral region of the cavity CV are formed in a way that the surfaces of the pads P2 are located at a position recessed to the inner side of the board from the surface of the resin layer 12b by a predetermined depth. Specifically, recessed portions DP1 are formed at the positions corresponding to the pads P1 on the resin layer 12b in the cavity CV, and recessed portions DP2 are formed at the positions corresponding to the pads P2 on the resin layer 12b in the peripheral region of the cavity CV. Since the other configuration of the wiring board 10b is basically the same as that of the wiring board 10 in FIG. 1, the description thereof is omitted herein.

The wiring board 10b according to the present embodiment can be basically fabricated in the same manner as the processing performed in each of the steps (FIGS. 2A to 4C) of the aforementioned manufacturing method according to the first embodiment. However, processing steps for forming the recessed portions DP1 in the cavity CV and the recessed portions DP2 in the peripheral region of the cavity CV are needed, so that processing performed in the steps related to the formation is slightly different. Although it is not illustrated in particular, an example of the manufacturing method is as follows.

First, in the same manner as the processing performed in the steps in FIGS. 2A to 2E, a plating resist (resist layer 62) provided with required opening portions OP1 and OP2 at corresponding portions in positions on and outside the step portion SP, respectively, is formed on the surface of the support base member 60a where the step portion SP is formed.

Next, a sacrifice conductive layer is formed with a required thickness (thickness equivalent to the depth of the recessed portions DP1 and DP2 to be formed) on the support base member (CU) 60a by electrolytic plating using the support base member 60a as a power feeding layer, the support base member 60a exposed through the opening portions OP1 and OP2 of the resist layer 62. As the material forming the sacrifice conductive layer, a metal species soluble in an etchant is selected in considering that the material is eventually etched away with the support member 60a in contact therewith. In this case, since copper (Cu) is used as the material of the support base member 60a, the sacrifice conductive layer (Cu) is formed on the support base member 60a by electrolytic Cu plating. Use of the same material (Cu) for these two components in this manner allows these components (the support base member 60a and the sacrifice conductive layer) to be simultaneously removed by one etching operation, and thus, contributes to simplification of the process.

Next, in the same manner as the process performed in the step in FIG. 3A, the pads P1 and P2 are formed on the sacrifice conductive layer (Cu) exposed through the opening portions OP1 and OP2 of the resist layer 62, respectively. Specifically, the pads P1 and P2 are formed by sequentially stacking an Au/Pd layer (or Au layer), a Ni layer and a Cu layer by electrolytic plating using the support base member 60a as a power feeding layer. Thereafter, the resist layer is removed, and the same process as that in each of the steps in FIGS. 3C to 4B is performed. Then, the support base member (Cu) 60a and the sacrifice conductive layer (Cu) are subjected to etching together.

Through the aforementioned steps, the wiring board 10b (FIG. 8) of the present embodiment is fabricated.

Note that, as in the case of the second embodiment, in the present embodiment too, the support base member 60a and the sacrifice conductive layer, which are subjected to etching at the final stage, do not have to be made of the same material (Cu). Basically, it is sufficient as long as each of the components is formed of a material which can be "selectively" etched away with respect to the other exposed components when each of the support base member and the sacrifice conductive layer is etched away. These two components may be made of mutually different materials.

According to the third embodiment (FIG. 8), the same effects as those obtained in the aforementioned second embodiment (FIG. 7) can be obtained. Specifically, the recessed portions DP1 are formed at the positions corresponding to the pads P1 on the resin layer 12b in the cavity CV, and the recessed portions DP2 are formed at the positions corresponding to the pads P2 on the resin layer 12b in the peripheral region of the cavity CV. Thus, pre-solder (solder attachment) can be easily performed in these recessed portions DP1 and DP2. Thereby, when an electronic component (chip) is bonded to the package 10b, position adjustment between the electrode terminals of the chip and the attached pieces of solder can be easily performed. In addition, when POP bonding is performed (FIGS. 5 and 6), position adjustment between electrode pads of another package and the attached pieces of solder can be easily performed.

In each of the above embodiments, the method of forming the cavity CV for placing an electronic component (chip) in the package 10 (10a or 10b) is described with the example in which the cavity CV is formed by etching using the etching resist 61 (FIG. 2C) patterned in a required shape as the mask. However, the method of forming the cavity CV is not limited to this, as a matter of course. For example, in the step in FIG. 2B, the resist layer to be formed on the support base member 60 may be set to be a plating resist of a pattern reversal (positive and negative relationship) to the illustrated pattern. Then, a required cavity CV can be formed by using the plating resist.

In this case, the plating resist is provided with an opening portion at a position corresponding to the position (in size slightly larger than the chip mounting area CM) of the cavity CV. Thereafter, a sacrifice conductive layer (Cu) is formed with a required thickness (thickness equivalent to the depth of the cavity CV) on the support base member (Cu) 60 by electrolytic Cu plating using the support base member 60a as a power feeding layer, the support base member (Cu) 60 exposed through the opening portion of the plating resist. Then, the same process as that performed in each of the steps in FIGS. 2E to 4B is performed after the plating resist is removed. Finally, the support base member (Cu) and the sacrifice conductive layer (Cu) are simultaneously etched away. Thereby, the desired package 10 (10a or 10b) can be obtained.

What is claimed is:

1. A wiring board comprising: an outermost insulating layer having a first surface and a second surface opposite to the first surface, the outermost insulating layer including a cavity formed on the first surface thereof at a position corresponding to an electronic component mounting area;
   a multilayer structure in which a plurality of wiring layers and insulating layers are built up one after the other on the second surface of the outermost insulating layer;
   a first pad formed on a bottom surface of the cavity and exposed from the first surface of the outermost insulating layer;
   a second pad formed on and exposed from the first surface of the outermost insulating layer in a peripheral region of the cavity; and
   vias formed in the outermost insulating layer and electrically connecting a wiring layer positioned on the second surface of the outermost insulating layer to the first pad and the second pad, respectively, wherein an exposed surface of the first pad is flush with the first surface of the outermost insulating layer, and an exposed surface of the second pad is flush with the first surface of the outermost insulating layer.

2. The wiring board according to claim 1, further comprising a semiconductor element mounted on the wiring board.

3. A wiring board comprising:
   an outermost insulating layer having a first surface and a second surface opposite to the first surface, the outermost insulating layer including a cavity formed on the first surface thereof, at a position corresponding to an electronic component mounting area;

a multilayer structure in which a plurality of wiring layers and insulating layers are built up one after the other on the second surface of the outermost insulating layer;

a first pad formed on a bottom surface of the cavity and exposed at a position recessed from the bottom surface of the cavity to an inner side of the outermost insulating layer;

a second pad formed on and exposed from the first surface of the outermost insulating layer in a peripheral region of the cavity; and vias formed in the outermost insulating layer and electrically connecting a wiring layer positioned on the second surface of the outermost insulating layer to the first pad and the second pad, respectively.

4. The wiring board according to claim 3, further comprising a semiconductor element mounted on the wiring board.

5. The wiring board according to claim 3, wherein an exposed surface of the second pad is flush with the first surface of the outermost insulating layer.

6. The wiring board according to claim 3, wherein the outermost insulating layer further includes a recessed portion formed on the first surface thereof, at a position corresponding to the second pad.

* * * * *